(12) United States Patent
Lee et al.

(10) Patent No.: US 9,490,337 B2
(45) Date of Patent: Nov. 8, 2016

(54) SEMICONDUCTOR DEVICE AND METHOD FOR FABRICATING THE SAME

(71) Applicant: HYUNDAI MOTOR COMPANY, Seoul (KR)

(72) Inventors: Jong Seok Lee, Suwon-si (KR); Kyoung-Kook Hong, Hwaseong-si (KR); Dae Hwan Chun, Gwangmyung-si (KR); Youngkyun Jung, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 15/051,023

(22) Filed: Feb. 23, 2016

(65) Prior Publication Data

US 2016/0172461 A1    Jun. 16, 2016

Related U.S. Application Data

(62) Division of application No. 14/025,789, filed on Sep. 12, 2013, now Pat. No. 9,299,782.

(30) Foreign Application Priority Data

Dec. 18, 2012 (KR) .................. 10-2012-0148602

(51) Int. Cl.
*H01L 21/00* (2006.01)
*H01L 29/66* (2006.01)
(Continued)

(52) U.S. Cl.
CPC ..... *H01L 29/66068* (2013.01); *H01L 29/0878* (2013.01); *H01L 29/4236* (2013.01); *H01L 29/7813* (2013.01); *H01L 29/1608* (2013.01); *H01L 29/41766* (2013.01)

(58) Field of Classification Search
CPC .................. H01L 21/02444; H01L 29/66068; H01L 21/02447
USPC ............................................ 438/105; 257/77
See application file for complete search history.

(56) References Cited

U.S. PATENT DOCUMENTS

| 8,772,112 B1 | 7/2014 | Chun et al. | |
| 9,082,815 B2 * | 7/2015 | Sugimoto | ........... H01L 29/7397 |
| 2011/0193131 A1 * | 8/2011 | Blanchard | ........... H01L 29/0839 257/139 |
| 2012/0098055 A1 | 4/2012 | Darwish et al. | |

OTHER PUBLICATIONS

Non-Final Office Action dated Feb. 17, 2015, issued in corresponding U.S. Appl. No. 14/025,789.
Notice of Allowance dated Nov. 23, 2015, issued in corresponding U.S. Appl. No. 14/025,789.

* cited by examiner

*Primary Examiner* — Theresa T Doan
(74) *Attorney, Agent, or Firm* — McDermott Will & Emery LLP

(57) ABSTRACT

A semiconductor device includes: a plurality of n type pillar regions and an n− type epitaxial layer disposed on a first surface of an n+ type silicon carbide substrate; a p type epitaxial layer and an n+ region disposed on the plurality of n type pillar regions and the n− type epitaxial layer; a trench penetrating the n+ region and the p type epitaxial layer and disposed on the plurality of n type pillar regions and the n− type epitaxial layer; a gate insulating film disposed within the trench; a gate electrode disposed on the gate insulating film; an oxide film disposed on the gate electrode; a source electrode disposed on the p type epitaxial layer, the n+ region, and the oxide film; and a drain electrode disposed on a second surface of the n+ type silicon carbide substrate, wherein each corner portion of the trench is in contact with a corresponding n type pillar region.

5 Claims, 9 Drawing Sheets

(51) Int. Cl.
H01L 29/78 (2006.01)
H01L 29/08 (2006.01)
H01L 29/423 (2006.01)
H01L 29/417 (2006.01)
H01L 29/16 (2006.01)

SEMICONDUCTOR DEVICE AND METHOD FOR FABRICATING THE SAME

CROSS-REFERENCE TO RELATED APPLICATION

This Application is a Divisional of U.S. application Ser. No. 14/025,789, filed Sep. 12, 2013 which in turn claims priority to and the benefit of Korean Patent Application No. 10-2012-01 48602 filed in the Korean Intellectual Property Office on Dec. 18, 2012, the entire contents of which are incorporated herein by reference.

BACKGROUND OF THE DISCLOSURE (a) Field of the Disclosure

The present disclosure relates to a semiconductor device including silicon carbide (SiC) and a method for fabricating the same.

(b) Description of the Related Art

With the recent trend toward large-sized and large-capacity application apparatuses, a power semiconductor device having a high breakdown voltage, a high current capacity, and high-speed switching characteristics has become necessary.

Accordingly, much research and development is being conducted on MOSFETs (metal oxide semiconductor field effect transistors) using silicon carbide (SiC), instead of conventional MOSFETs using silicon. Particularly, there is a lot of development of vertical trench MOSFETs.

A MOSFET is one of the most common electric field transistors in both digital and analog circuits of power semiconductor devices.

In the case of a MOSFET using silicon carbide, a silicon dioxide ($SiO_2$) serves as a gate insulating film. In the case of a vertical trench MOSFET in which a gate insulating film is positioned within a trench, an interface state between the silicon dioxide film and silicon carbide is not good, and this has an effect on the flow of electrons and current passing through a channel of the MOSFET, thereby lowering the mobility of the electrons and increasing the on-resistance of the MOSFET.

The above information disclosed in this Background section is only for enhancement of understanding of the background of the disclosure and therefore it may contain information that is not prior art.

SUMMARY OF THE DISCLOSURE

The present disclosure has been made in an effort to reduce the on-resistance of a silicon carbide MOSFET using a trench gate.

An exemplary embodiment of the present disclosure provides a semiconductor device including: a plurality of n type pillar regions and an n− type epitaxial layer disposed on a first surface of an n+ type silicon carbide substrate; a p type epitaxial layer and an n+ region disposed on the plurality of n type pillar regions and the n− type epitaxial layer; a trench penetrating the n+ region and the p type epitaxial layer, and disposed on the plurality of n type pillar regions and the n− type epitaxial layer; a gate insulating film disposed within the trench; a gate electrode disposed on the gate insulating film; an oxide film disposed on the gate electrode; a source electrode disposed on the p type epitaxial layer, the n+ region, and the oxide film; and a drain electrode disposed on a second surface of the n+ type silicon carbide substrate, wherein each corner portion of the trench is in contact with a corresponding n type pillar region.

A doping concentration of the plurality of n type pillar regions may be higher than a doping concentration of the n− type epitaxial layer.

An exemplary embodiment of the present disclosure provides a method for fabricating a semiconductor device, the method including: forming a first buffer layer pattern on a first surface of an n+ type silicon carbide substrate so as to expose a first portion of the first surface of the n+ type silicon carbide substrate; forming a plurality of n type pillar regions by a first epitaxial growth on the first portion of the first surface of the n+ type silicon carbide substrate; removing the first buffer layer pattern so as to expose a second portion of the first surface of the n+ type silicon carbide substrate adjacent to the first portion of the first surface of the n+ type silicon carbide substrate; forming a second buffer layer pattern on the plurality of n type pillar regions; forming an n− type epitaxial layer by a second epitaxial growth on the second portion of the first surface of the n+ type silicon carbide substrate; forming a p type epitaxial layer by a third epitaxial growth on the n− type epitaxial layer; forming an n+ region by a fourth epitaxial growth on the p type epitaxial layer; and forming a trench by penetrating the n+ region and the p type epitaxial layer, and etching the plurality of n type pillar regions and the n− type epitaxial layer, wherein each corner portion of the trench is in contact with a corresponding n type pillar region.

The plurality of n type pillar regions and the first buffer layer pattern may have the same thickness.

The plurality of n type pillar regions and the n− type epitaxial layer may have the same thickness.

The method for fabricating a semiconductor device according to the exemplary embodiment of the present disclosure may further include: after forming the n+ region, forming a gate insulating film within the trench; forming a gate electrode on the gate insulating film; forming an oxide film on the gate insulating film and the gate electrode; and forming a source electrode on the p type epitaxial layer, the n+ region, and the oxide film and forming a drain electrode on a second surface of the n+ type silicon carbide substrate.

According to an exemplary embodiment of the present disclosure, the n type pillar regions having a higher doping concentration than a doping concentration of the n− type epitaxial layer are respectively disposed on each corner portion of the trench, whereby the on-resistance of the semiconductor device may be reduced. As a result, upon turn-on of the semiconductor device, the flow of electrons and current may be increased.

DETAILED DESCRIPTION OF EXEMPLARY EMBODIMENTS

Figure 1:
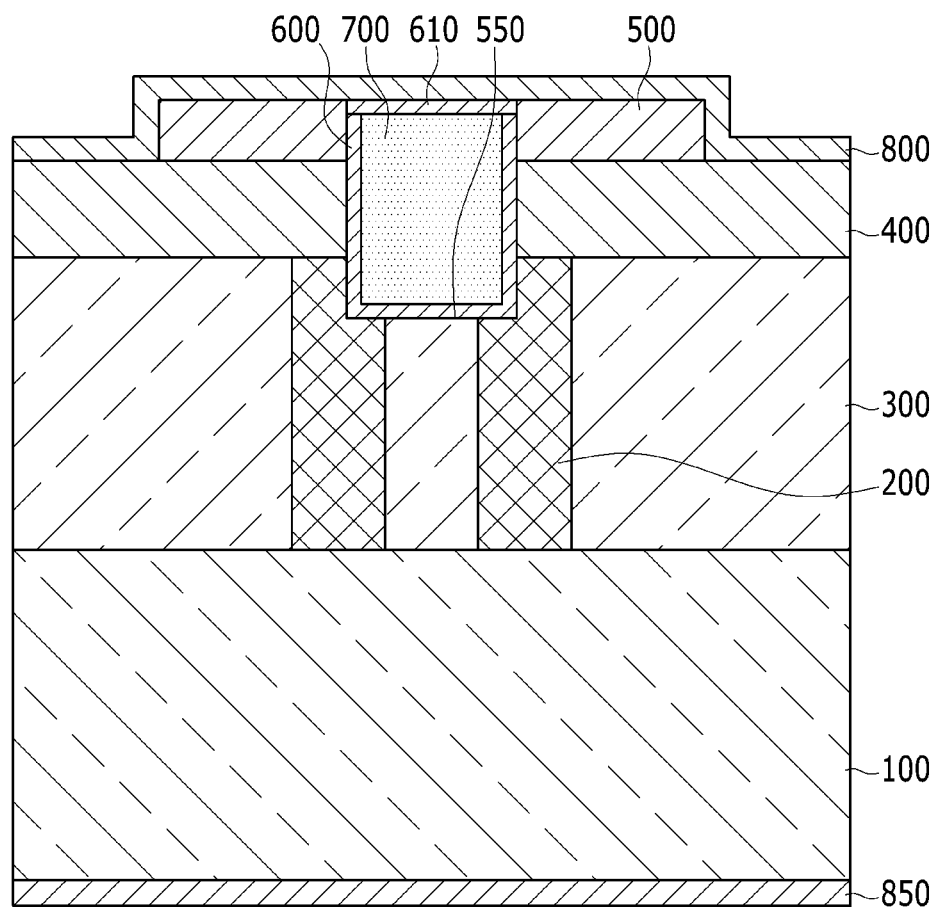
FIG. 1 is a cross-sectional view of a semiconductor device according to an exemplary embodiment of the present disclosure.

Exemplary embodiments of the present disclosure will be described in detail with reference to the attached drawings.

The present disclosure may be modified in many different forms and should not be construed as being limited to the exemplary embodiments set forth herein. Rather, the exemplary embodiments of the present disclosure are provided so that this disclosure will be thorough and complete, and will fully convey the concept of the present disclosure to those having ordinary skill in the art.

In the drawings, the thickness of layers and regions may be exaggerated for clarity. In addition, when a layer is described to be formed, disposed, etc., on another layer or on a substrate, this means that the layer may be formed directly on the other layer or directly on the substrate, or a third layer may be interposed between the layer and the other layer or the substrate so that the layer may be formed indirectly on the other layer or indirectly on the substrate. Like numbers refer to like elements throughout the specification.

FIG. 1 is a cross-sectional view of a semiconductor device according to an exemplary embodiment of the present disclosure.

Referring to FIG. 1, the semiconductor device according to the present exemplary embodiment has a plurality of n type pillar regions 200 and an n− type epitaxial layer 300 disposed on a first surface of an n+ type silicon carbide substrate 100. The doping concentration of the n type pillar regions 200 is higher than the doping concentration of the n− type epitaxial layer 300.

A p type epitaxial layer 400 and an n+ region 500 are sequentially disposed on the n type pillar regions 200 and the n− type epitaxial layer 300.

A trench 550 is disposed in the n type pillar regions 200, the n− type epitaxial layer 300, the p type epitaxial layer 400, and the n+ region 500. The trench 550 penetrates the n+ region 500 and the p type epitaxial layer 400. Each corner portion of the trench is in contact with a corresponding n type pillar region 200.

A gate insulating film 600 is disposed within the trench 550, a gate electrode 700 is disposed on the gate insulating film 600, and an oxide film 610 is disposed on the gate insulating film 600 and the gate electrode 700. The gate electrode 700 may fill the trench 550.

A source electrode 800 is formed on the p type epitaxial layer 400, the n+ region 500, and the oxide film 610. A drain electrode 850 is formed on a second surface of the n+ type silicon carbide substrate 100.

The doping concentration of the n type pillar regions 200 is higher than the doping concentration of the n− type epitaxial layer 300. Hence, upon a turn-on of the semiconductor device, most of the electrons and current flowing out through the channel of the semiconductor device moves to the drain electrode 850 through the n type pillar regions 200. Upon a turn-on of the semiconductor device, the electrons and current moving to the drain electrode 850 have less resistance, and therefore the on-resistance of the semiconductor device may be reduced. As a result, the flow of electrons and current may be increased.

A method for fabricating a semiconductor device according to an exemplary embodiment of the present disclosure will now be described in detail with reference to FIGS. 2 to 8.

FIGS. 2 to 8 are views sequentially showing a method for fabricating a semiconductor device according to an exemplary embodiment of the present disclosure.

Figure 2:
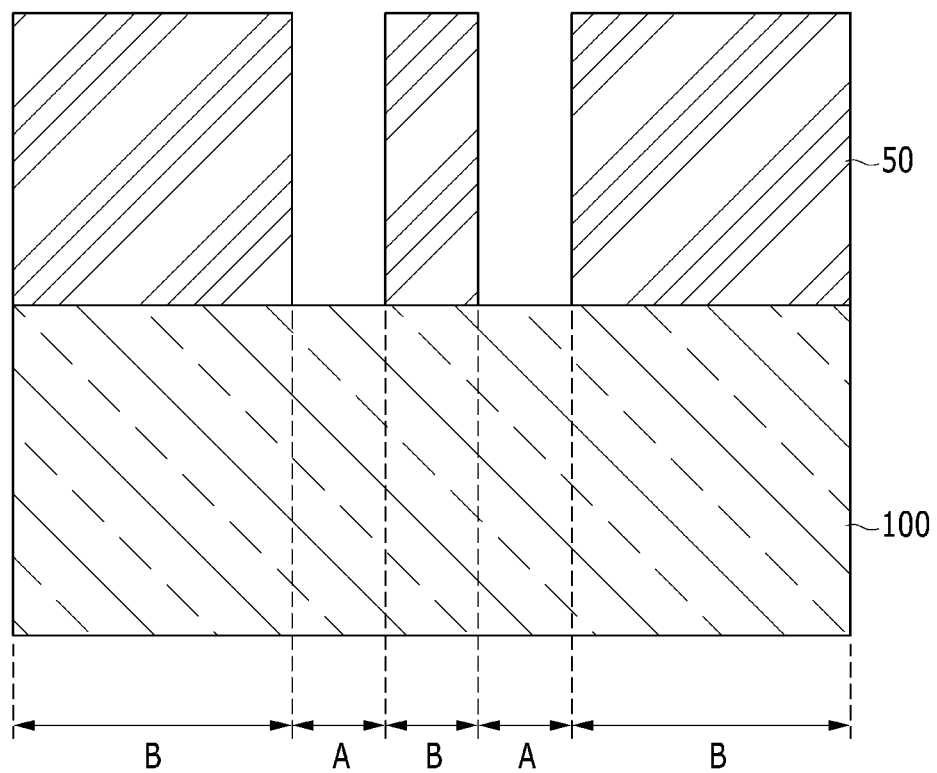
FIGS. 2 to 8 are views sequentially showing a method for fabricating a semiconductor device according to an exemplary embodiment of the present disclosure.

As shown in FIG. 2, an n+ type silicon carbide substrate 100 is prepared, and a first buffer layer pattern 50 is formed on a first surface of the n+ type silicon carbide substrate 100. The first buffer layer pattern 50 exposes a first portion A of the first surface of the n+ type silicon carbide substrate 100.

Figure 3:
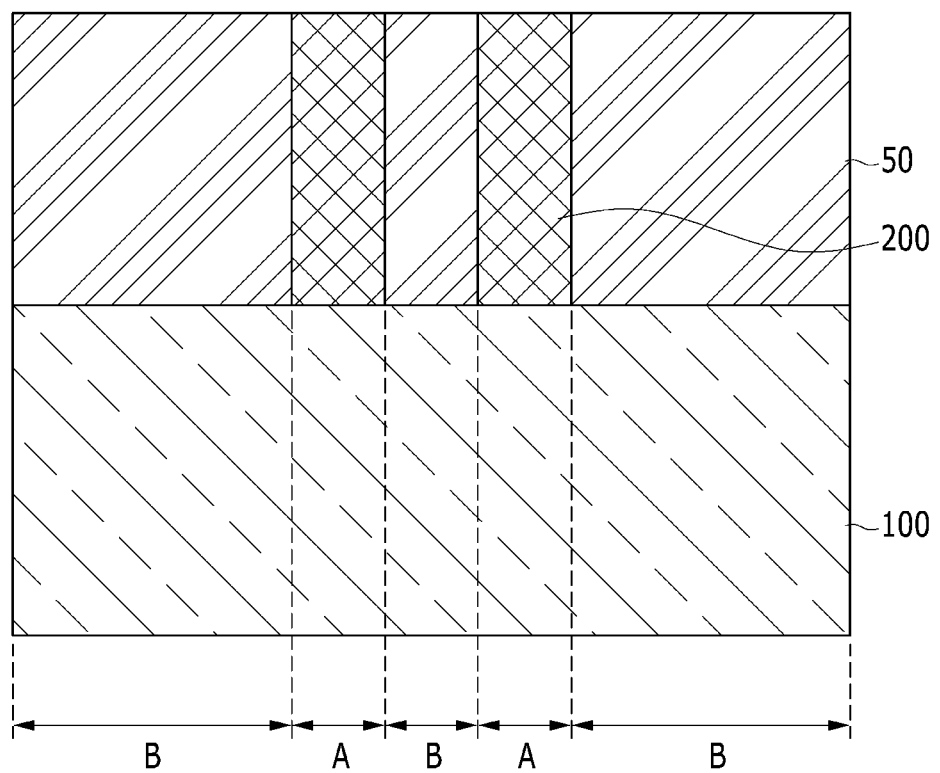

As shown in FIG. 3, a plurality of n type pillar regions 200 are formed by, e.g., a first epitaxial growth on the first portion A of the first surface of the n+ type silicon carbide substrate 100. The n type pillar regions 200 and the first buffer layer pattern 50 may have the same thickness.

Figure 4:
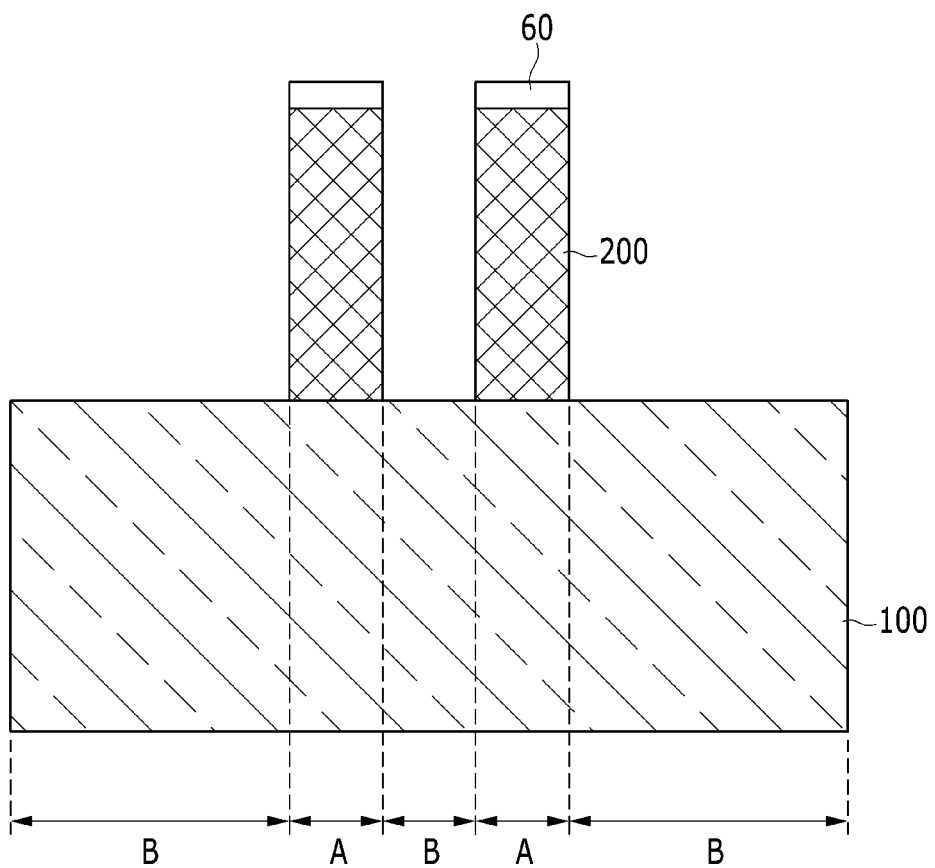

As shown in FIG. 4, the first buffer layer pattern 50 is removed to expose a second portion B of the first surface of the n+ type silicon carbide substrate 100, and then a second buffer layer pattern 60 is formed on the n type pillar regions 200.

Figure 5:
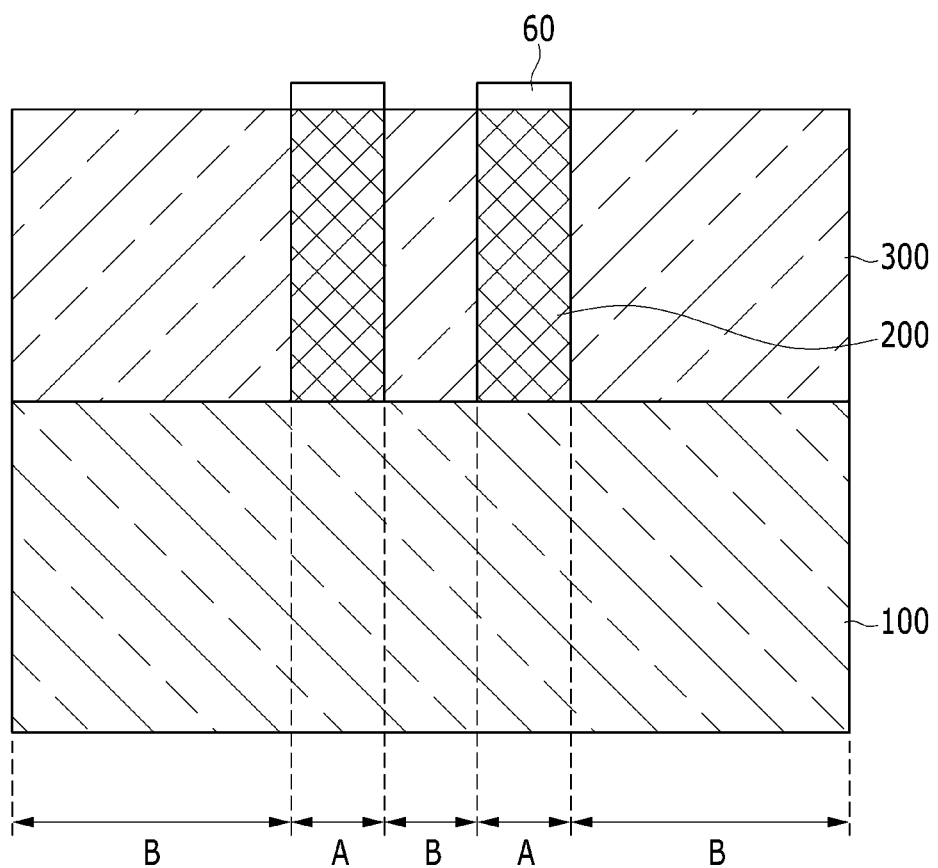

As shown in FIG. 5, an n− type epitaxial layer 300 is formed by a second epitaxial growth on the second portion B of the first surface of the n+ type silicon carbide substrate 100. The second epitaxial growth does not occur on the n type pillar regions 200 due to the second buffer layer pattern 60. The n− type epitaxial layer 300 and the n type pillar regions 200 may have the same thickness.

Figure 6:
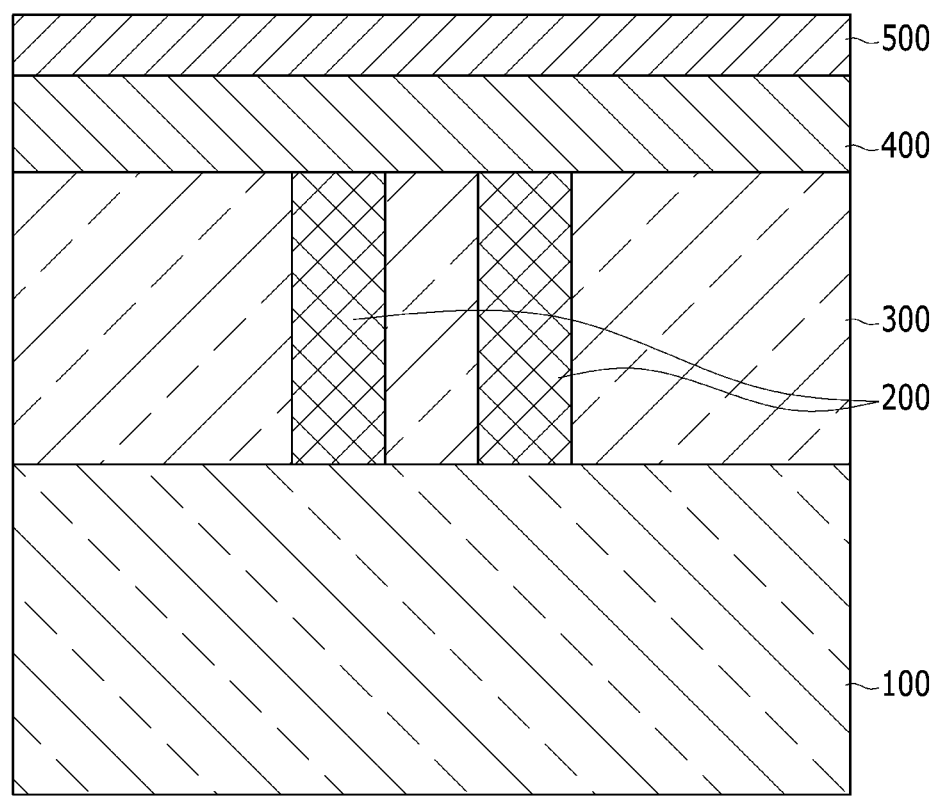

As shown in FIG. 6, a p type epitaxial layer 400 is formed by a third epitaxial growth on the n− type epitaxial layer 300 and the n type pillar regions 200, and then an n+ region 500 is formed by a fourth epitaxial growth on the p type epitaxial layer 400.

Although the n+ region 500 is formed by the fourth epitaxial growth in the present exemplary embodiment, the n+ region 500 may also be formed by, e.g., implanting n+ ions into part of a surface of the p type epitaxial layer 400 without performing epitaxial growth.

Figure 7:
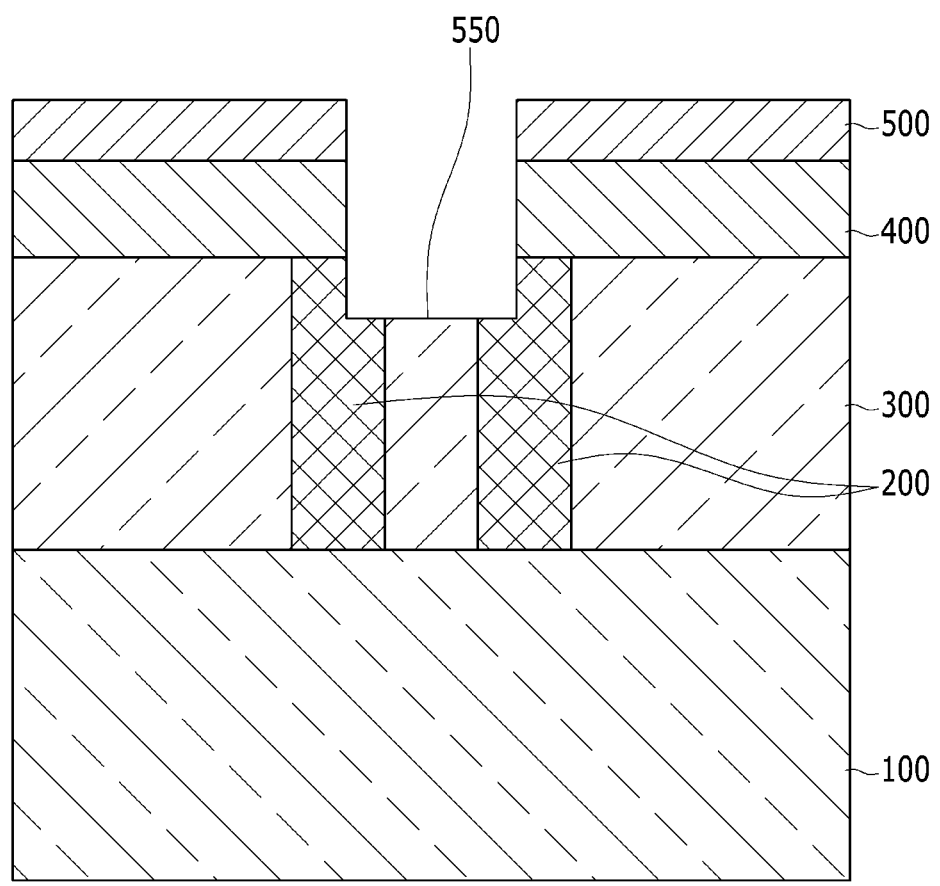

As shown in FIG. 7, a trench 550 is formed by penetrating the n+ region 500 and the p type epitaxial layer 400, and etching part of the n− type epitaxial layer 300 and the n type pillar regions 200. Each corner portion of the trench 550 is in contact with a corresponding n type pillar region 200.

Figure 8:
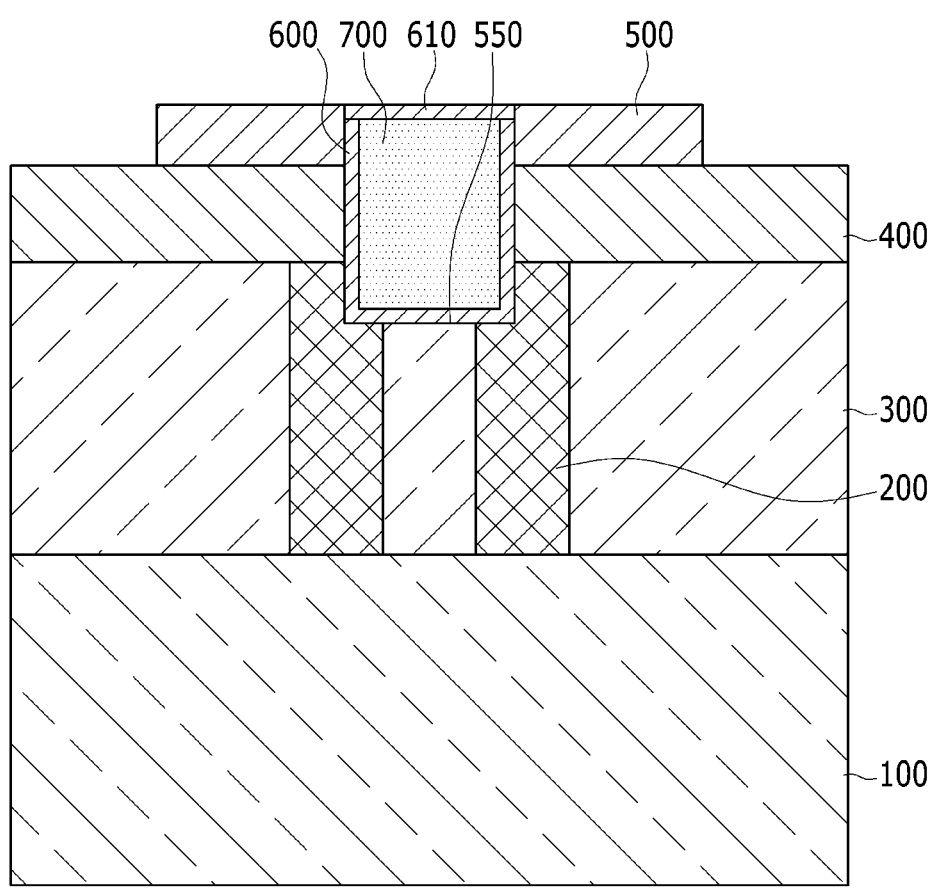

As shown in FIG. 8, a gate insulating film 600 is formed within the trench 550, and a gate electrode 700 is formed on the gate insulating film 600. An oxide film 610 is formed on the gate insulating film 600 and the gate electrode 700, and part of the n+ region 500 is etched.

As shown in FIG. 1, a source electrode 800 is formed on the p type epitaxial layer 400, the n+ region 500, and the oxide film 610, and a drain electrode 850 is formed on a second surface of the n+ type silicon carbide substrate 100.

Now, the characteristics of a semiconductor device according to an exemplary embodiment of the present disclosure and the characteristics of a conventional semiconductor device will be described in detail with reference to FIG. 9.

Figure 9:
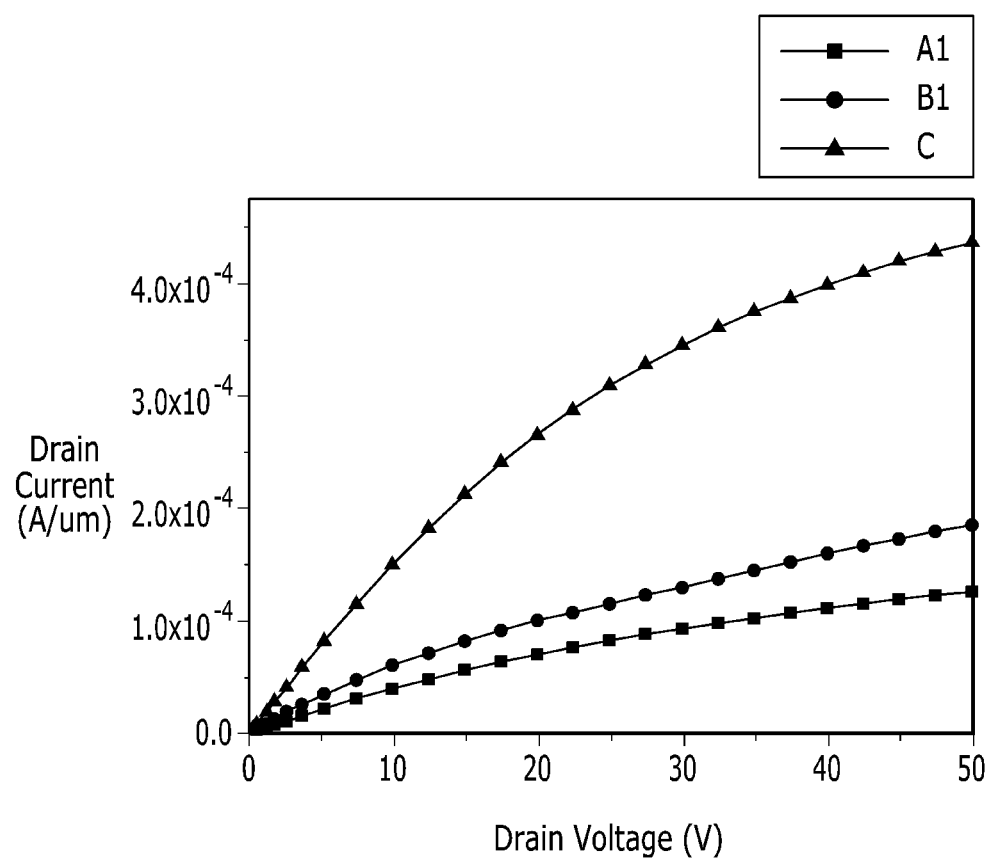
FIG. 9 is a graph comparing the on-resistance of a semiconductor device according to an exemplary embodiment of the present disclosure with the on-resistance of a conventional semiconductor device.

In FIG. 9, A1 indicates a typical vertical trench MOSFET, B1 indicates a vertical trench MOSFET using a horizontal n type epitaxial layer, and C indicates a semiconductor device according to an exemplary embodiment of the present disclosure.

FIG. 9 is a graph comparing the on-resistance of a semiconductor device according to an exemplary embodiment of the present disclosure with the on-resistance of a conventional semiconductor device.

Referring to FIG. 9, the on-resistance of the typical vertical trench MOSFET A1 was 21.7 m$\Omega \cdot$cm$^2$, the on-resistance of the vertical trench MOSFET B1 using the horizontal n type epitaxial layer was 13 m $\Omega \cdot$cm$^2$, and the on-resistance of a semiconductor device C according to an exemplary embodiment of the present disclosure was 5.6 m$\Omega \cdot$cm$^2$.

Based upon these findings, the on-resistance of the semiconductor device according to the exemplary embodiment of the present disclosure was compared with the on-resistance of the conventional semiconductor device. The results show that the on-resistance of the semiconductor device according to the exemplary embodiment of the present disclosure was about 70% lower than the on-resistance of the typical vertical trench MOSFET, and was about 57% lower than the on-resistance of the vertical trench MOSFET using the horizontal n type epitaxial layer.

That is, the on-resistance of the semiconductor device according to the exemplary embodiment of the present disclosure was reduced as compared with the on-resistance of conventional semiconductor devices.

While this disclosure has been described in connection with what is presently considered to be practical exemplary embodiments, it should be understood that the disclosure is not limited to the disclosed exemplary embodiments, but on the contrary, is intended to cover various modifications and equivalent arrangements included within the spirit and scope of the appended claims.

| <Description of symbols> | |
|---|---|
| 50: first buffer layer pattern | 60: second buffer layer pattern |
| 100: n+ type silicon carbide substrate | 200: n type pillar region |
| 300: n− type epitaxial layer | 400: p type epitaxial layer |
| 550: trench | |
| 500: n+ region | 600: gate insulating film |
| 610: oxide film | 700: gate electrode |
| 800: source electrode | 850: drain electrode |

What is claimed is:

1. A method for fabricating a semiconductor device, the method comprising:
    forming a first buffer layer pattern on a first surface of an n+ type silicon carbide substrate so as to expose a first portion of the first surface of the n+ type silicon carbide substrate;
    forming a plurality of n type pillar regions by a first epitaxial growth on the first portion of the first surface of the n+ type silicon carbide substrate;
    removing the first buffer layer pattern so as to expose a second portion of the first surface of the n+ type silicon carbide substrate adjacent to the first portion of the first surface of the n+ type silicon carbide substrate;
    forming a second buffer layer pattern on the plurality of n type pillar regions;
    forming an n− type epitaxial layer by a second epitaxial growth on the second portion of the first surface of the n+ type silicon carbide substrate;
    forming a p type epitaxial layer by a third epitaxial growth on the n− type epitaxial layer;
    forming an n+ region by a fourth epitaxial growth on the p type epitaxial layer; and
    forming a trench by penetrating the n+ region and the p type epitaxial layer, and etching the plurality of n type pillar regions and the n− type epitaxial layer,
    wherein each corner portion of the trench is in contact with a corresponding n type pillar region.

2. The method of claim 1, wherein a doping concentration of the plurality of n type pillar regions is higher than a doping concentration of the n− type epitaxial layer.

3. The method of claim 2, wherein the plurality of n type pillar regions and the first buffer layer pattern have the same thickness.

4. The method of claim 3, wherein the plurality of n type pillar regions and the n− type epitaxial layer have the same thickness.

5. The method of claim 1, further comprising:
    after forming the n+ region, forming a gate insulating film within the trench;
    forming a gate electrode on the gate insulating film;
    forming an oxide film on the gate insulating film and the gate electrode; and
    forming a source electrode on the p type epitaxial layer, the n+ region, and the oxide film and forming a drain electrode on a second surface of the n+ type silicon carbide substrate.

* * * * *